United States Patent
Kuse

(10) Patent No.: US 7,306,956 B2
(45) Date of Patent: Dec. 11, 2007

(54) VARIABLE TEMPERATURE AND DOSE ATOMIC LAYER DEPOSITION

(75) Inventor: Ronald John Kuse, Fujimi (JP)

(73) Assignee: Intel Corporation, Santa Clara, CA (US)

( * ) Notice: Subject to any disclaimer, the term of this patent is extended or adjusted under 35 U.S.C. 154(b) by 678 days.

(21) Appl. No.: 10/674,883

(22) Filed: Sep. 30, 2003

(65) Prior Publication Data
US 2005/0070121 A1    Mar. 31, 2005

(51) Int. Cl.
  *H01L 21/66* (2006.01)
  *H01L 21/44* (2006.01)
  *H01L 21/31* (2006.01)
(52) U.S. Cl. ............... 438/14; 438/680; 438/763; 257/E21.171
(58) Field of Classification Search ........... 438/680, 438/14, 763
See application file for complete search history.

(56) References Cited

U.S. PATENT DOCUMENTS

| | | | |
|---|---|---|---|
| 5,480,818 A | 1/1996 | Matsumoto et al. | |
| 6,144,060 A | 11/2000 | Park et al. | |
| 6,200,893 B1 | 3/2001 | Sneh | |
| 6,203,613 B1 * | 3/2001 | Gates et al. | 117/104 |
| 2002/0144786 A1 * | 10/2002 | Chiang et al. | 156/345.51 |
| 2002/0195056 A1 * | 12/2002 | Sandhu et al. | 118/719 |
| 2005/0016956 A1 * | 1/2005 | Liu et al. | 216/67 |

* cited by examiner

*Primary Examiner*—Alexander Ghyka
(74) *Attorney, Agent, or Firm*—Blakely, Sokoloff, Taylor & Zafman LLP

(57) ABSTRACT

A variable temperature and/or reactant dose atomic layer deposition (VTD-ALD) process modulates ALD reactor conditions (e.g., temperature, flow rates, etc.) during growth of a film (e.g., metallic) on a wafer to produce different film properties a different film depths.

19 Claims, 4 Drawing Sheets

VARIABLE TEMPERATURE AND DOSE ATOMIC LAYER DEPOSITION

BACKGROUND

1. Field

Embodiments of the present invention relate to integrated circuits and, in particular, to integrated circuit fabrication processes.

2. Discussion of Related Art

It is common to use a process known as atomic layer deposition (ALD) to deposit films on semiconductor wafers to fabricate transistors, for example. In ALD, the semiconductor (e.g., silicon, germanium) wafer is placed in a reactor. A precursor material is pulsed into the reactor. The precursor material subsequently adsorbs and reacts on the wafer surface. The precursor material may be any one of hundreds of possible materials, depending on the reaction product (i.e., metal oxide film, metal nitride film, etc.) desired. The reactor is then purged with an inert gas to remove the precursor material. A second reactant material is pulsed into the reactor. The second reactant material reacts with the precursor material on the wafer surface. Selection of the second reactant material depends on the reaction product desired and on which precursor material was selected. The reactor is purged again.

This process of precursor pulsing, reactor purging, reactant pulsing, and reactor purging is called a "cycle." In ALD, the thickness of the deposited film is controlled by the number of cycles.

In current ALD processes, where metal oxide films are to be deposited on silicon wafers, the films are deposited using preset conditions for the reactor and materials used that remain constant throughout the deposition process. There are drawbacks to using preset conditions, however.

For example, using one discrete set of preset conditions may produce a film that has good insulation against current leakage but also causes silicon oxide or metal silicate at the interface between the silicon wafer surface and the metal oxide film to be formed. Interfacial silicon oxide or metal silicate can be problematic because these materials have relatively low permittivity, which reduces the effective dielectric constant of a transistor's gate stack.

A reduced effective dielectric constant results in reduced capacitance, which reduces transistor drive current for a given dielectric film thickness. When the transistor drive current is reduced the speed performance of the device degrades. Using another discrete set of preset conditions may produce a film having very little to essentially no interfacial silicon oxide or metal silicate but produces a film with poor insulation against current leakage.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
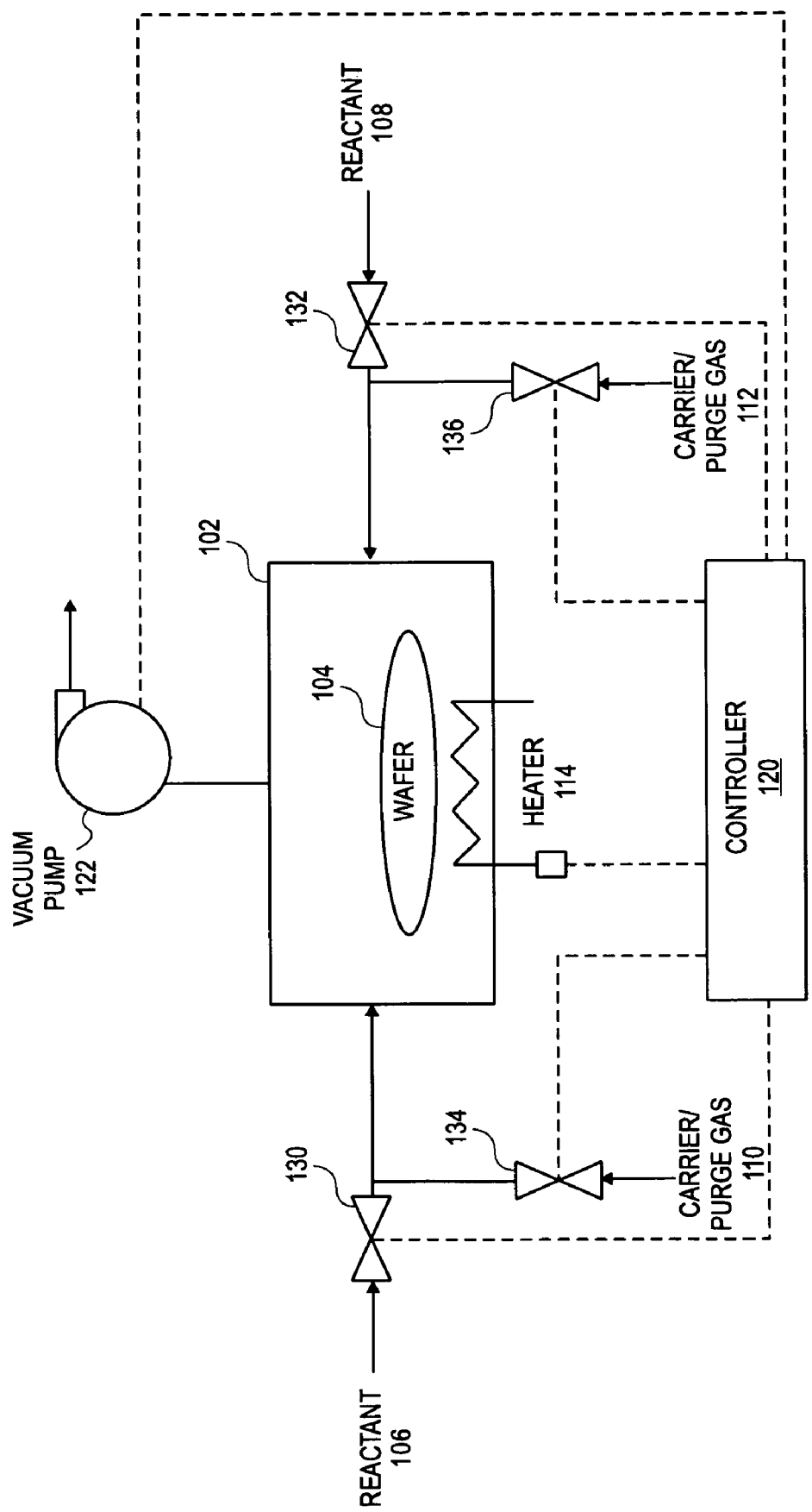
FIG. 1 is a high-level block diagram of a system suitable for depositing a film on a substrate according to an embodiment of the present invention.

FIG. 1 is high-level block diagram of a variable temperature and dose atomic layer deposition (VTD-ALD) system 100 suitable for implementing embodiments of the present invention. The system 100 includes a reactor 102 for receiving a wafer 104 during deposition of films (e.g., metallic films).

The VTD-ALD system 100 also includes a reactant 106 coupled to the reactor 102 via a valve 130, a reactant 108 coupled to the reactor 102 via a valve 132, a carrier/purge gas 110 coupled to the reactor 102 via a valve 134, and a carrier/purge gas 112 coupled to the reactor 102 via a valve 136. A controller 120 may be coupled to the valves 130, 132, 134, and 136 to control the flow of reactant 106, the reactant 108, the carrier/purge gas 110, the carrier/purge gas 112, respectively into the reactor 102.

The reactor 102 may include a heater 114. The controller 120 may be coupled to the heater 114 to control the operation the heater 114 to modulate the temperature of the reactor 102 during the film deposition process.

The VTD-ALD system 100 may include a vacuum pump 122, which may be coupled to the reactor 102. The controller 120 may be coupled to the vacuum pump 122 to control the operation of the vacuum pump 122.

The reactor 102 may be any suitable ALD reactor. ALD reactors suitable for implementing the reactor 102 are well known.

The wafer 104 may be any suitable wafer or substrate. The wafer 104 may be a silicon wafer. Other suitable materials may be used to implement the wafer 104 and after reading the description herein persons of ordinary skill in the relevant art will readily recognize how to implement embodiments of the present invention for other materials.

In one embodiment, the reactant 106 may be aluminum-based (e.g., $Al(CH_3)_3$), Ti-based, Zr-based, Hf-based, Ta-based, etc. Of course, the reactant 106 depends on the film to be deposited and after reading the description herein a person of ordinary skill in the relevant art will readily recognize how to implement embodiments of the present invention using various reactants or precursors.

In one embodiment, the reactant 108 may be oxygen-based (e.g., $H_2O$, $O_2$, $O_3$, $H_2O_2$, $CH_3OH$, $C_2H_5OH$, etc.), nitrogen-based (e.g., $NH_3$, etc.), or other suitable precursor material. Of course, the reactant 108 depends on the film to be deposited and after reading the description herein a person of ordinary skill in the relevant art will readily recognize how to implement embodiments of the present invention using various reactants.

The carrier/purge gas 110 may be any gas that does not react with the reactant 106. In embodiments of the present invention, the carrier/purge gas 110 may be argon (Ar), nitrogen ($N_2$), and helium (He). Suitable carrier materials are well known and after reading the description herein a person of ordinary skill in the relevant art will readily recognize how to implement embodiments of the present invention using various carrier/purge materials.

The carrier/purge gas 112 may be any gas that does not react with the reactant 106 or reaction products (e.g., metal films). In one embodiment, the carrier/purge gas 112 is the same as the carrier/purge gas 110. In other embodiments, the carrier/purge gas 112 is different from the carrier/purge gas 110. Suitable carrier/purge materials are well known and after reading the description herein a person of ordinary skill in the relevant art will readily recognize how to implement embodiments of the present invention using various carrier/purge materials.

The heater 114 may be any capable of heating the reactor 102 to a specified temperature. Heaters used in film deposition equipment are well known.

The controller 120 may be any suitable analog, digital, software, hardware, firmware, etc., (e.g., a microprocessor, a microcontroller) controller that performs VTD-ALD processes according to embodiments of the present invention. For example, the controller 120 may control operation of the valve 130, the valve 132, the valve 134, and the valve 136 to modulate the flow rate of materials into the reactor 102 during the film deposition process.

The vacuum pump 122 may be any suitable pump capable of removing exhaust gases from the reactor 102. Vacuum pumps used in film deposition equipment are well known.

Figure 2:
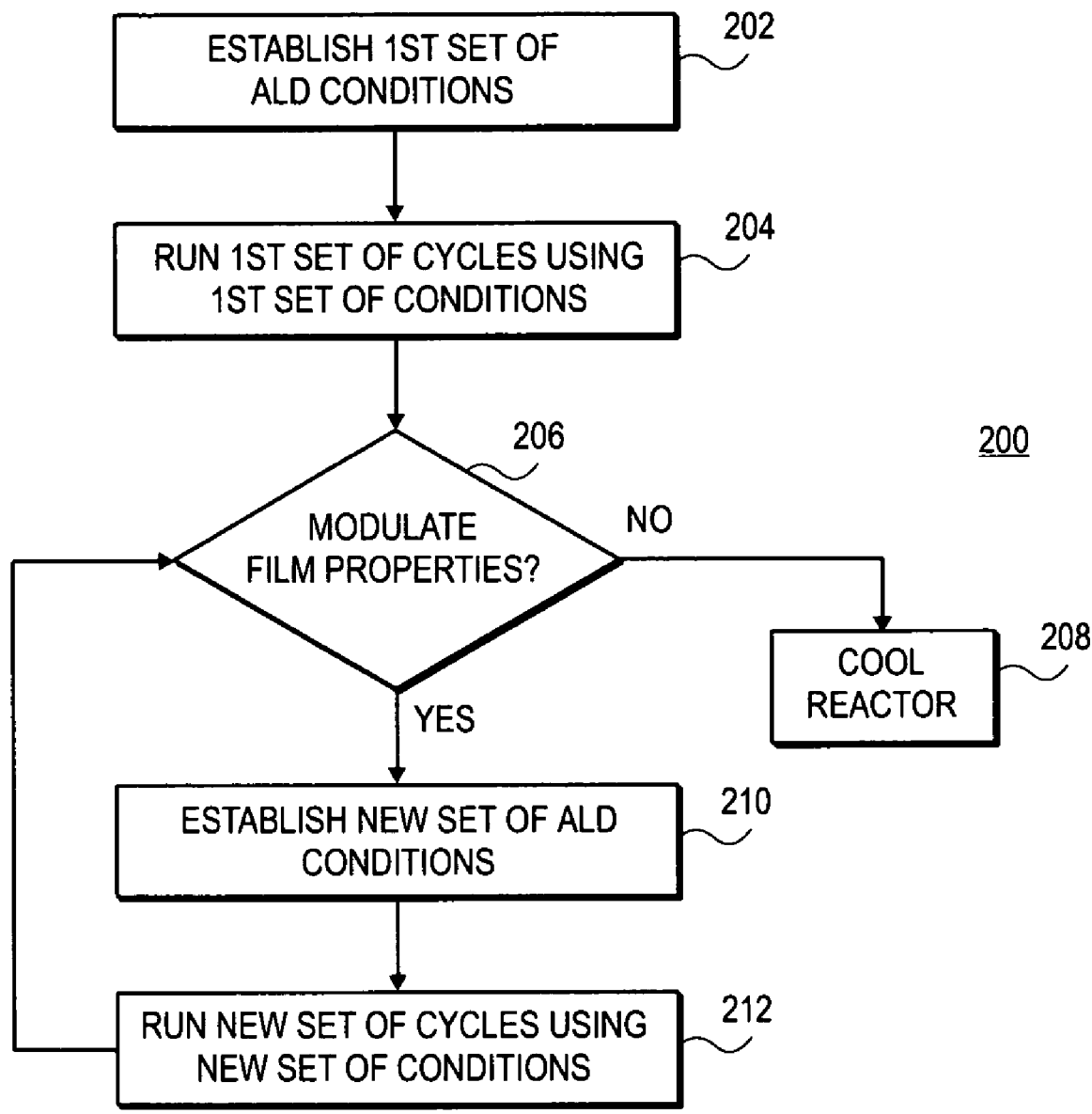
FIG. 2 is a flowchart illustrating an approach to depositing a film on a substrate according to an embodiment of the present invention.

FIG. 2 is a flowchart illustrating a VTD-ALD process 200 according to an embodiment of the present invention. The process 200 is only an example process and other processes may be used. Additionally, the order in which operations are described should not be construed to imply that the operations are necessarily order-dependent or that the operations be performed in the order in which they are presented. A machine-accessible medium with machine-accessible instructions thereon may be used to cause the controller 120 or other machine to perform the process 200 or portions thereof.

In a block 202, a first set of ALD conditions are established. For example, a first set of material (i.e., the reactant 106, the reactant 108, the carrier/purge gas 110, and the carrier/purge gas 112) flow rates are established, a first reactor 102 temperature is established, a first reactor 102 pressure is established, and a first number of cycles to be run is established.

In one embodiment, the first reactant 106 flow rate may be established at around approximately 100-300 standard cubic centimeters per minute (SCCM). However, the actual flow rate will depend on the materials to be deposited, the size of the reactor, and other factors. In one embodiment, the first reactant 108 flow rate may be established at around 5-50 SCCM.

In one embodiment, the first flow rate of the carrier/purge gas 110 may be established at around approximately 500-700 SCCM and the first flow rate of the carrier/purge gas 112 at around approximately 500-700 SCCM.

Of course, the individual flow rates for the reactant 106, the reactant 108, the carrier/purge gas 110, and/or the carrier/purge gas 112 may range from very small (e.g., around approximately one SCCM) to very large (e.g., in excess of approximately ten thousand SCCM). Optimal flow rates for ALD materials depend on the size of the reactor used, the particular precursor, the particular reactant, the desired deposition rate, and desired film properties. After reading the description herein a person of ordinary skill in the relevant art will readily recognize how to implement embodiments of the present invention for various first flow rates.

In one embodiment, the first temperature of the reactor 102 may be established at 200 degrees Centigrade (200C).

Of course, the particular first temperature may be established at anywhere from approximately room temperature to the decomposition temperature of the particular materials used. After reading the description herein a person of ordinary skill in the relevant art will readily recognize how to implement embodiments of the present invention for various first temperatures.

In one embodiment, the first reactor 102 pressure may be established at less than or equal to approximately ten torr. Of course, the particular first pressure depends on the size of the reactor used, the particular precursor, the particular reactant, the desired deposition rate, and desired film properties. After reading the description herein a person of ordinary skill in the relevant art will readily recognize how to implement embodiments of the present invention for various first temperatures.

In one embodiment, the first number of cycles to be run is established at twenty. Because the first number of cycles run determines the first depth, greater or fewer cycles may be used depending on the desired depth for the first set of properties.

In a block 204, the first set of cycles is run using the first set of ALD conditions. In one embodiment, the carrier/purge gas 110 flow is started. For each cycle, the reactor 102 is pulsed with the reactant 106. The reactant 106 reacts with the surface of the wafer 104. The reactor 102 is then purged with the carrier/purge gas 112 to remove any chemically active reactant 106. The reactor 102 is pulsed with the reactant 108, which reacts with the reactant 106 and the wafer 104. The reactor 102 again is purged with the carrier/purge gas 112 to remove any chemically active reactant 108. The first depth is grown in a layer-by-layer manner such that running the first set of cycles yields twenty monolayers of growth.

In a block 206, the process 200 determines whether to modulate the film properties. If it is not appropriate to modulate the properties of the film, the reactor 102 is cooled in a block 208 and a film is produced having a depth corresponding to the number of cycles run and the properties corresponding to the first set of ALD conditions. If it is appropriate to modulate the properties of the film, the process 200 proceeds to a block 210.

It may be appropriate to modulate the properties of the film when the reactant 106 is trimethyl aluminum ($Al(CH_3)_3$), the reactant 108 is water ($H_2O$), the temperature of the reactor 102 is 200C, and twenty cycles are run. This is because the interface between the silicon (Si) wafer and the beginning growth of an alumina ($Al_2O_3$) film produced by the trimethyl aluminum ($Al(CH_3)_3$) and the silicon (Si) may be substantially free from silicon oxide or metal silicate, however, under these same ALD conditions, the first set of monolayers in the film have reduced insulating capabilities as a result of contaminants introduced by unreacted reactant 106/reactant 108 materials. The reduced insulation results in inappropriately high current leakage in devices.

If it is decided to modulate the properties of the film, in a block 210, a new set of ALD conditions are established. For example, a new set of material (i.e., the reactant 106, the reactant 108, the carrier/purge gas 110, and the carrier/purge gas 112) flow rates may be established, a new reactor 102 temperature may be established, a new reactor 102 pressure may be established, and/or a new number of cycles to be run may be established. In embodiments of the present invention, establishing the first and new sets of conditions may be continuous, incremental, increasing, decreasing, reversing, etc.

Typically, the carrier/purge gas 110 and the carrier/purge gas 112 flow rates remain constant. Also, the reactor 102 pressure may remain constant. However, changing the reactant 106 flow rate, the reactant 108 flow rate, and/or the reactor 102 temperature each may have a different effect on the properties of the next set of monolayers.

In one embodiment, the new reactant 106 flow rate is established at closer to around approximately 250 SCCM, the new reactant 108 flow rate is established at closer to around approximately twenty SCCM, the new temperature of the reactor 102 is established at approximately 300 C, and the new number of cycles to be run is established to be forty.

In a block 212, the new number of cycles is run using the new set of ALD conditions. In one embodiment, forty cycles are run using the new set of conditions. For each cycle, the reactor 102 is pulsed with the reactant 106. The reactant 106 reacts with the surface of the wafer 104. The reactor 102 is then purged with the carrier/purge gas 112 to remove any chemically active reactant 106. The reactor 102 is pulsed with the reactant 108, which reacts with the reactant 106 and the wafer 104. The reactor 102 again is purged with the carrier/purge gas 112 to remove any chemically active reactant 108. The next depth is grown in a layer-by-layer manner such that running the next set of cycles yields forty monolayers of growth.

It may be appropriate to stop the process 200 at this point when the reactant 106 is trimethyl aluminum ($Al(CH_3)_3$), the reactant 108 is water ($H_2O$), the temperature of the reactor 102 is 300C, and forty cycles are run. Because the interface between the silicon (Si) wafer and the beginning growth of an alumina ($Al_2O_3$) film is substantially free from silicon oxide or metal silicate, and the new set of monolayers in the film have good insulating capabilities (i.e., at the higher reactor temperature there are fewer unreacted reactant 106/reactant 108 materials). The films produced according to this embodiment of the present invention also may have low flatband voltage shifts.

Note that metallic films produced according to embodiments of the present invention can be tailored for a particular application. Films having unique properties produced according to embodiments of the present invention also can be duplicated.

After the block 212, the process 200 may return to block 206 and be run iteratively to obtain another set of properties at particular depths for the film. Subsequent sets of ALD conditions may be used to modulate the properties of subsequent sets of film monolayers.

Figure 3:
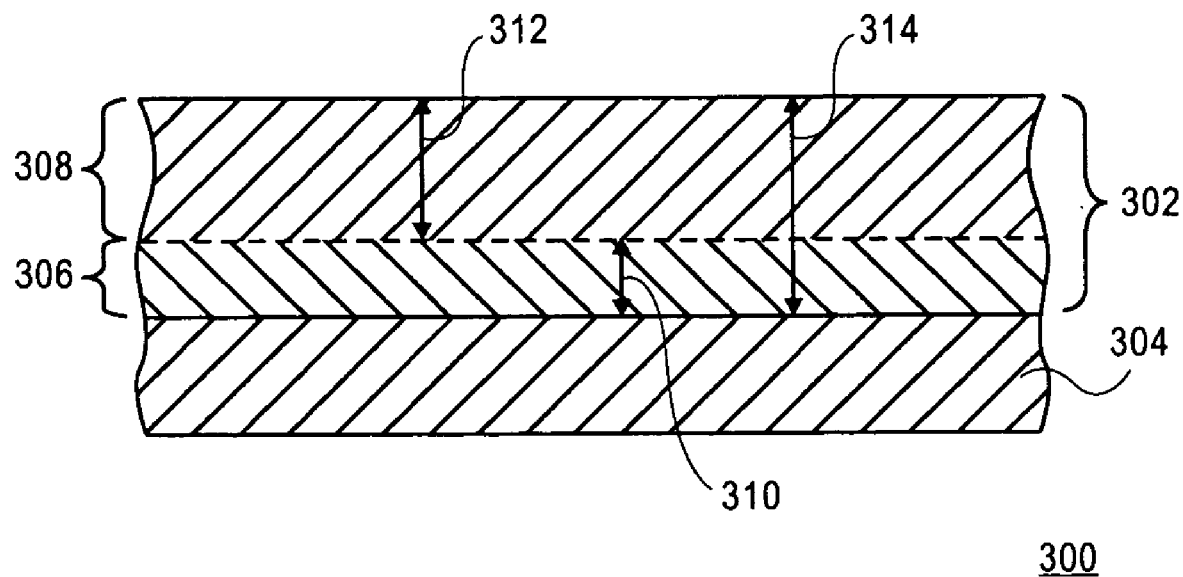
FIG. 3 is a cross-section view illustrating a metallic film deposited on a substrate according to an embodiment of the present invention.

FIG. 3 is a cross-section view of a device 300 having a metallic film 302 deposited on a substrate 304 according to an embodiment of the present invention. The metallic film 302 includes a first set of monolayers 306 and a second set of monolayers 308.

The first set of monolayers 306 has a depth 310. The second set of monolayers 308 has a depth 312. The metallic layer 302 has a depth 314.

In one embodiment, the ALD conditions used to deposit the first set of monolayers 306 are different from the ALD conditions used to deposit the second set of monolayers 308. As a result, the electrical properties of the first set of monolayers 306 are different from the electrical properties of the second set of monolayers 308. Thus, the metallic layer 302 has different electrical properties throughout its depth 314.

Although embodiments of the present invention have been described with respect to depositing only two sets of monolayers, embodiments of the present invention are not so limited. For example, it may be appropriate to have a film whose properties gradually change from top to bottom. In this embodiment, an individual reaction condition (temperature, reactant, reactant flow rate, etc.) may be modulated each subsequent cycle (e.g., there may be one hundred different ALD cycles run each with different ALD conditions resulting in a film having one hundred monolayers each having a different set of properties).

Figure 4:
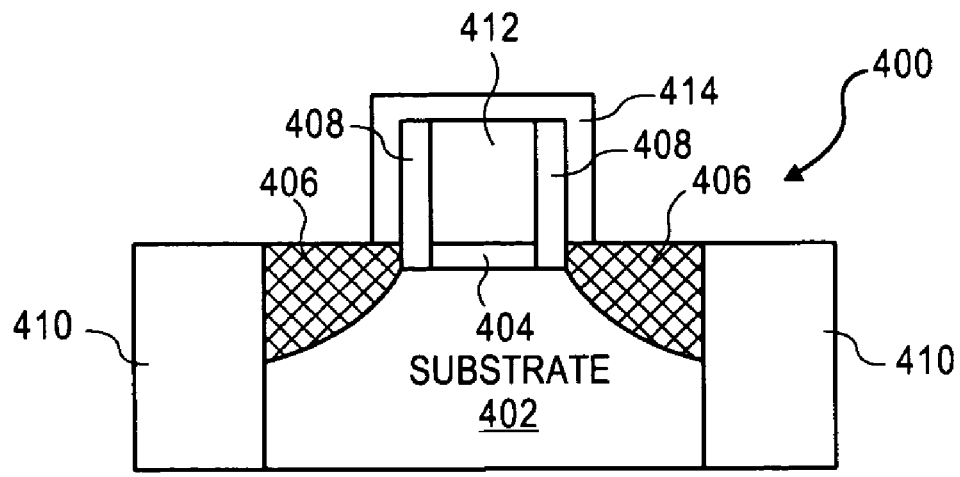
FIG. 4 is a cross-section view illustrating a transistor fabricated according to embodiments of the present invention.

FIG. 4 is a cross-section view illustrating a transistor 400 fabricated according to embodiments of the present invention. The example transistor 400 includes a substrate 402 and a gate dielectric layer 404 formed on the substrate 402. The gate dielectric layer 404 may be a metallic film deposited on the substrate 402 according to embodiments of the present invention.

The illustrated transistor 400 also includes a gate electrode 406 formed on the gate dielectric layer 404, two vertical sidewall dielectric spacers 408 formed on the sides of the gate dielectric layer 404 and the gate electrode 406, and shallow trench isolation (STI) regions 410 formed in the substrate 402.

The gate dielectric layer 404 may be any suitable material to insulate the gate electrode 406 from the substrate 402. The gate electrode 406 may be polysilicon or other suitable material. The two vertical sidewall spacers 408 may be any suitable dielectric material. The STI regions 410 may be dielectric material and separate the transistor 400 from other transistors formed on the substrate 400.

Figure 5:
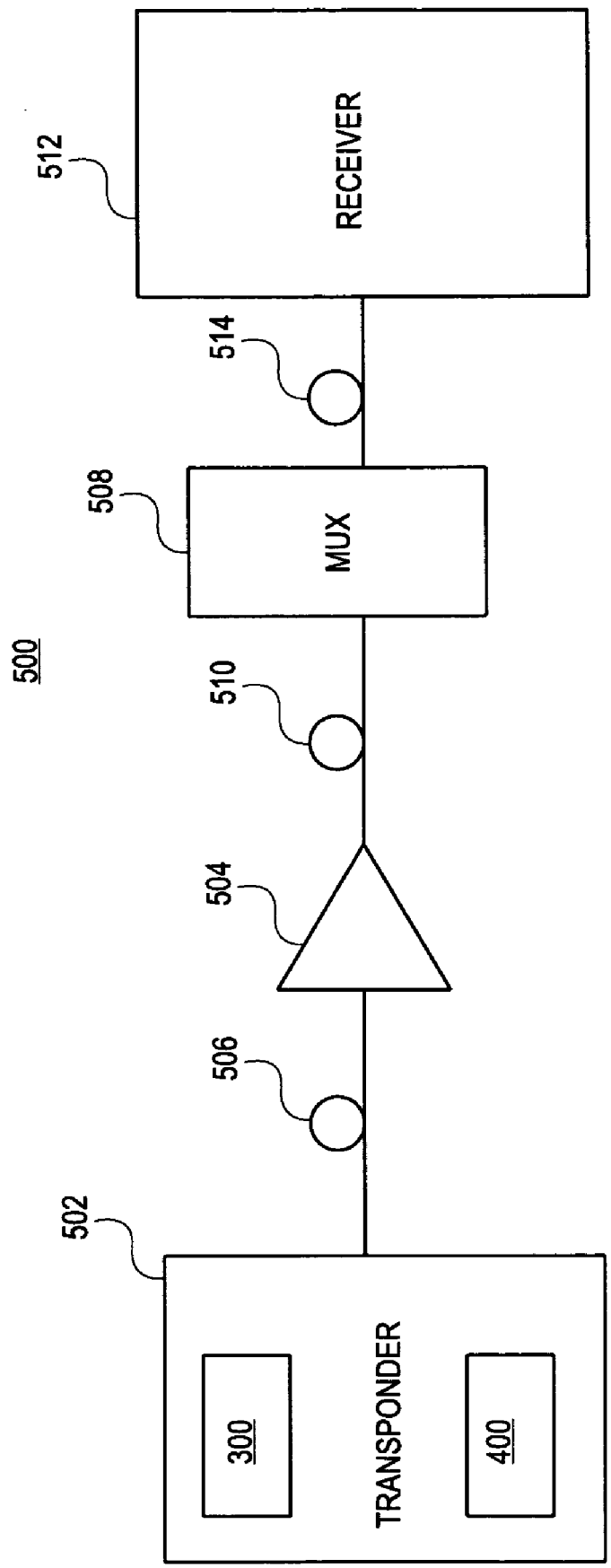
FIG. 5 is a high-level block diagram of an optical system according to an embodiment of the present invention.

FIG. 5 is a high-level block diagram of an optical system 500 according to an embodiment of the present invention. The system 500 includes a transponder 502 coupled to an optical amplifier 504 via an optical fiber 506. The optical amplifier 504 is coupled to a multiplexer 508 via an optical fiber 510. The multiplexer 508 is coupled to a transponder 512 via an optical fiber 514. The transponder 502 includes the device 300 and/or the transistor 400.

Although only one transponder 502, optical amplifier 504, optical fiber set 506, 510, and 514, multiplexer 508, and transponder 512 are shown, it is common to have numerous transponders, optical amplifiers, optical fiber sets, and multiplexers in optical communication systems. Single units are shown for simplicity. The transponder 502 may transmit optical beams to the receiver 512. Although not shown for purposes of simplicity, the transponder 502 also may receive optical beams from the transponder 510.

The optical amplifier 506 may be an erbium (Er) doped fiber amplifier (EDFA). Alternatively, the optical amplifier 506 may be an ytterbium (Yb) doped fiber amplifier, a praseodymium (Pr) doped fiber amplifier, a neodymium (Nd) doped fiber amplifier, or other suitable optical amplifier.

The multiplexer 508 may be a DWDM multiplexer. Alternatively, the multiplexer 508 may be an add-drop multiplexer.

Embodiments of the present invention may be implemented using hardware, software, or a combination thereof. In implementations using software, the software may be stored on a machine-accessible medium. A machine-accessible medium includes any mechanism that provides (i.e., stores and/or transmits) information in a form accessible by a machine (e.g., a computer, network device, personal digital assistant, manufacturing tool, any device with a set of one or more processors, etc.).

For example, a machine-accessible medium includes recordable and non-recordable media (e.g., read only memory [ROM], random access memory [RAM], magnetic disk storage media, optical storage media, flash memory devices, etc.), as well as electrical, optical, acoustic, or other form of propagated signals (e.g., carrier waves, infrared signals, digital signals, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the embodiments of the invention, as those skilled in the relevant art will recognize. These modifications can be made to embodiments of the invention in light of the above detailed description.

In the above description, numerous specific details, such as particular processes, materials, devices, and so forth, are presented to provide a thorough understanding of embodiments of the invention. One skilled in the relevant art will recognize, however, that the embodiments of the present invention can be practiced without one or more of the specific details, or with other methods, components, etc. In other instances, well-known structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the present invention to the specific embodiments disclosed in the specification and the claims. Rather, the scope of embodiments of the invention is to be determined entirely by the following claims, which are to be construed in accordance with established doctrines of claim interpretation.

What is claimed is:

1. A method, comprising:
    determining first properties of a metal oxide film to be disposed on a silicon substrate surface, the first properties of the metal oxide film to be determined by an interface between the silicon substrate surface and the metal oxide film;
    establishing first atomic layer deposition (ALD) conditions for depositing the metal oxide film having the first properties on the silicon substrate surface;
    growing at least one monolayer of the metal oxide film having the first properties using the first ALD conditions;
    determining second properties of the metal oxide film to be disposed on the at least one monolayer, the second properties of the metal oxide film to be determined by a bulk portion of the metal oxide film, the second properties being different from the first properties;
    establishing subsequent ALD conditions for depositing the metal oxide film having the second properties on the at least one monolayer; and
    growing at least one subsequent monolayer of the metal oxide film on the first monolayers using the subsequent ALD conditions.

2. The method of claim 1, wherein establishing the first ALD conditions comprises establishing a first ALD reactor temperature.

3. The method of claim 2, wherein establishing the subsequent ALD conditions comprises establishing at least one subsequent ALD reactor temperature different from the first ALD reactor temperature.

4. The method of claim 1, wherein establishing the first ALD conditions comprises:
    establishing a first flow rate for a first reactant; and
    establishing a first flow rate for a second reactant.

5. The method of claim 4, wherein establishing the subsequent ALD conditions comprises establishing at least one subsequent flow rate for the first reactant different from the first flow rate for the first reactant.

6. The method of claim 5, wherein establishing the subsequent ALD conditions comprises establishing at least one subsequent flow rate for the second reactant different from the first flow rate for the second reactant.

7. The method of claim 1, wherein establishing the first ALD conditions comprises establishing a first purge gas flow rate.

8. The method of claim 7, wherein establishing the subsequent ALD conditions comprises establishing at least one subsequent purge gas flow rate different from the first purge gas flow rate.

9. The method of claim 1, wherein establishing the first ALD conditions comprises establishing a first reactor pressure.

10. The method of claim 9, wherein establishing the subsequent ALD conditions comprises establishing at least one subsequent reactor pressure different from the first reactor pressure.

11. The method of claim 1, wherein establishing the first ALD conditions comprises establishing a first number of cycles to run.

12. The method of claim 11, wherein establishing the subsequent ALD conditions comprises establishing at least one subsequent number of cycles to run different from the first number of cycles to run.

13. The method of claim 1, wherein growing the at least one subsequent monolayer of the film on the first monolayers using the subsequent ALD conditions comprises growing the at least one subsequent monolayer having second properties different from the first properties.

14. A method, comprising:
    determining first properties of a metal oxide film to be disposed on a silicon substrate surface, the first properties of the metal oxide film to be determined by an interface between the silicon substrate surface and the metal oxide film;
    establishing first atomic layer deposition (ALD) conditions for depositing the metal oxide film having the first properties on the silicon substrate surface;
    running a first set of cycles in a reactor having the silicon substrate positioned therein using the first ALD conditions to grow at least one first monolayer of the metal oxide film, the at least one first monolayer having the first properties;
    determining subsequent properties of the metal oxide film to be disposed on the at least one monolayer, the subsequent properties of the metal oxide film to be determined by a bulk portion of the metal oxide film, the second properties being different from the first properties;

establishing subsequent ALD conditions for depositing the metal oxide film having the subsequent properties on the at least one monolayer; and running a subsequent set of cycles in the reactor using the subsequent ALD conditions to grow at least one subsequent monolayer of the metal oxide film, the at least one subsequent monolayer having subsequent properties different from the first properties.

15. The method of claim 14, further comprising:

disposing a carrier gas in the reactor;

pulsing the reactor with a first reactant at a first flow rate;

purging the reactor of the first reactant using the carrier gas;

pulsing the reactor with a second reactant;

purging the reactor of the second reactant using the carrier gas; and pulsing the reactor with the first reactant at second first flow rate different from the first reactant first flow rate.

16. The method of claim 14, further comprising:

disposing a carrier gas in the reactor;

pulsing the reactor with a first reactant;

purging the reactor of the first reactant using the carrier gas;

pulsing the reactor with a second reactant at a first flow rate;

purging the reactor of the second reactant using the carrier gas;

pulsing the reactor with the first reactant;

purging the reactor of the first reactant using the carrier gas; and pulsing the reactor with the second reactant at second first flow rate different from the second reactant first flow rate.

17. The method of claim 14, further comprising:

establishing a first temperature for the reactor;

disposing a carrier gas in the reactor;

pulsing the reactor with a first reactant;

purging the reactor of the first reactant using the carrier gas;

pulsing the reactor with a second reactant;

purging the reactor of the second reactant using the carrier gas; and establishing a second temperature for the reactor different from the first temperature.

18. The method of claim 17, further comprising:

pulsing the reactor with the first reactant;

purging the reactor of the first reactant using the carrier gas; and pulsing the reactor with the second reactant.

19. The method of claim 14, further comprising:

establishing a first pressure for the reactor;

disposing a carrier gas in the reactor;

pulsing the reactor with a first reactant;

purging the reactor of the first reactant using the carrier gas;

pulsing the reactor with a second reactant;

purging the reactor of the second reactant using the carrier gas; and establishing a second pressure for the reactor different from the first temperature.

* * * * *